US010612801B1

(12) United States Patent
Czamara et al.

(10) Patent No.: US 10,612,801 B1
(45) Date of Patent: Apr. 7, 2020

(54) ENVIRONMENTALLY CONTROLLED BOOTH

(71) Applicant: Amazon Technologies, Inc., Reno, NV (US)

(72) Inventors: Michael Phillip Czamara, Seattle, WA (US); Jerry James Hunter, Medina, WA (US)

(73) Assignee: Amazon Technologies, Inc., Seattle, WA (US)

( * ) Notice: Subject to any disclaimer, the term of this patent is extended or adjusted under 35 U.S.C. 154(b) by 689 days.

(21) Appl. No.: 13/737,733

(22) Filed: Jan. 9, 2013

(51) Int. Cl.
*F24F 7/00* (2006.01)

(52) U.S. Cl.
CPC ..................... *F24F 7/00* (2013.01)

(58) Field of Classification Search
CPC .. A61L 2/022; A61L 2/10; A61L 2/02; A61M 15/00; A61M 16/1065; A61M 21/00; E04H 1/1277; E04H 1/12; E04H 15/32; E04H 15/20; E04H 9/00; B08B 15/02; B08B 15/00; A61G 10/00; F24F 3/16; F24F 7/06; F24F 7/00; B09B 1/00; A24F 47/00
USPC ..... 297/343; 454/158, 187, 52, 184; 52/480, 52/664, 668, 79.1; 55/482, 483, 503; 600/21
See application file for complete search history.

(56) References Cited

U.S. PATENT DOCUMENTS

| | | | | |
|---|---|---|---|---|
| 1,388,091 A * | 8/1921 | Bresnahan | ................ | B60J 1/08 49/169 |
| 2,090,827 A * | 8/1937 | Bak | ...................... | E04H 1/1222 126/190 |
| 3,766,844 A * | 10/1973 | Donnelly | .............. | F24F 3/1603 135/116 |
| 3,844,232 A * | 10/1974 | Robinson | ................ | E05G 5/003 109/23 |
| 4,000,749 A * | 1/1977 | Busco | .................. | A61G 10/005 135/117 |
| 4,173,924 A * | 11/1979 | Bradshaw | ........... | B05B 15/1222 118/326 |
| 4,773,338 A * | 9/1988 | Hastings | ................... | E05G 5/02 109/11 |
| 4,934,396 A * | 6/1990 | Vitta | ..................... | E04H 1/1277 135/139 |
| 5,080,701 A * | 1/1992 | Howard | ................ | B08B 15/026 134/111 |
| RE33,810 E * | 2/1992 | Strieter | ................. | B08B 15/026 134/104.4 |
| 5,222,445 A * | 6/1993 | Capraro | .................. | G07F 19/20 109/2 |
| 5,277,654 A * | 1/1994 | Fenn | ....................... | F24F 3/161 454/141 |
| 5,322,473 A * | 6/1994 | Hofstra | .................. | A24F 47/00 454/186 |

(Continued)

*Primary Examiner* — Steven B McAllister
*Assistant Examiner* — Allen R Schult
(74) *Attorney, Agent, or Firm* — Robert C. Kowert; Kowert, Hood, Munyon, Rankin & Goetzel, P.C.

(57) ABSTRACT

A system includes one or more booths and an air moving system coupled to the booths. The booths may each include an enclosure, an interior space that accommodates a person, and one or more openings. The openings are such that a person in the booth can perform operations on a system or object outside the booth. The booth can be moved from one place to another relative to a floor. The air moving system cools air and moves the cooled air through the interior space of the booth.

28 Claims, 8 Drawing Sheets

(56) References Cited

U.S. PATENT DOCUMENTS

| | | | | |
|---|---|---|---|---|
| 5,479,787 A * | 1/1996 | Carter | ............... | F24F 1/00 |
| | | | | 454/236 |
| 5,533,305 A * | 7/1996 | Bielecki | ............... | A61L 2/022 |
| | | | | 297/343 |
| 5,558,112 A * | 9/1996 | Strieter | ............... | B08B 15/026 |
| | | | | 134/103.2 |
| 6,383,242 B1 * | 5/2002 | Rogers | ............... | B01D 46/42 |
| | | | | 454/63 |
| 7,134,444 B2 * | 11/2006 | Mintie | ............... | B08B 15/00 |
| | | | | 135/131 |
| 7,188,636 B1 * | 3/2007 | Kanne | ............... | B08B 15/02 |
| | | | | 135/142 |
| 7,448,945 B2 * | 11/2008 | Bessent | ............... | E04H 1/125 |
| | | | | 135/142 |
| 7,459,002 B2 * | 12/2008 | Kalous | ............... | F24F 3/1607 |
| | | | | 273/287 |
| 8,297,022 B2 * | 10/2012 | Cudney | ............... | F42D 5/04 |
| | | | | 52/63 |
| 9,285,132 B2 * | 3/2016 | Waulters | ............... | F24F 7/007 |
| 9,617,727 B2 * | 4/2017 | Saunier | ............... | A61M 21/0094 |
| 2001/0045718 A1 * | 11/2001 | Boirum | ............... | B25H 3/02 |
| | | | | 280/47.26 |
| 2003/0213359 A1 * | 11/2003 | Kropf | ............... | F41H 5/14 |
| | | | | 89/36.09 |
| 2007/0021046 A1 * | 1/2007 | Huang | ............... | B08B 15/023 |
| | | | | 454/61 |
| 2007/0050878 A1 * | 3/2007 | Ichigaya | ............... | A41D 13/0025 |
| | | | | 2/69 |

* cited by examiner

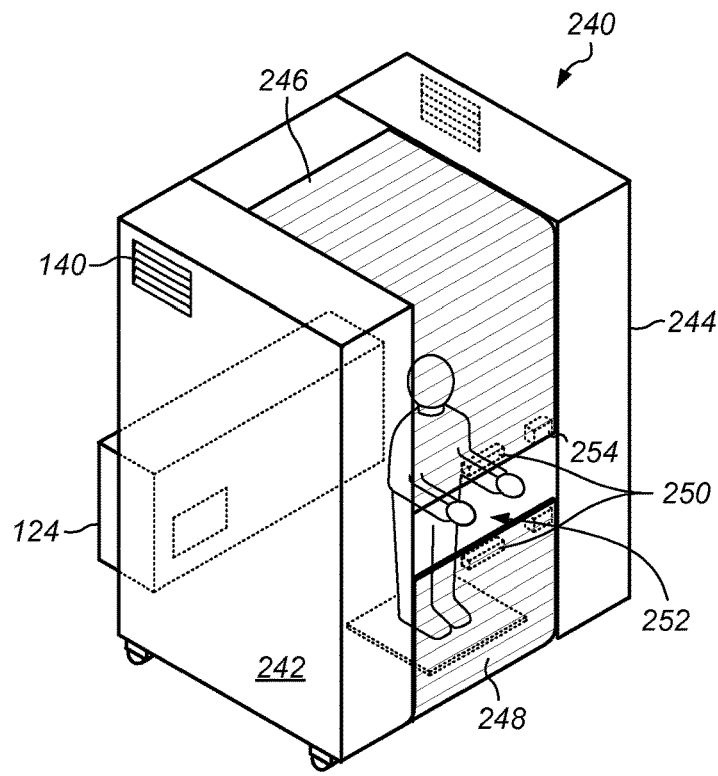
FIG. 4
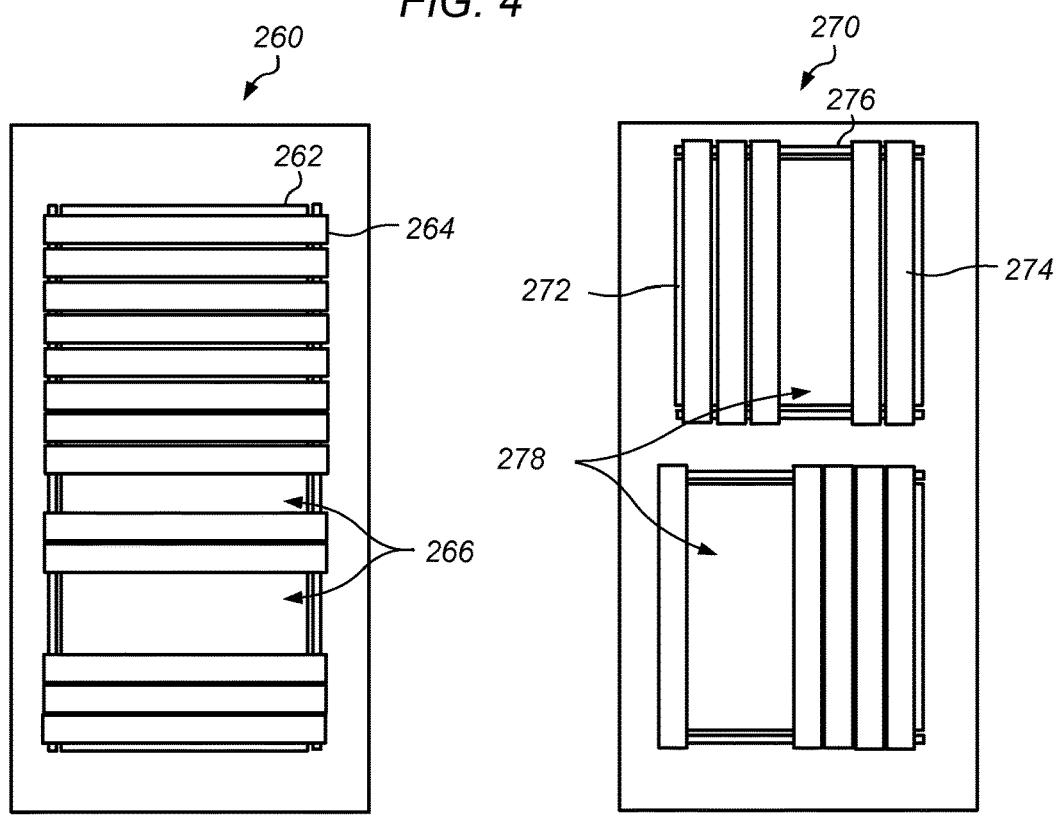
FIG. 5
FIG. 6

ENVIRONMENTALLY CONTROLLED BOOTH

BACKGROUND

Organizations such as on-line retailers, Internet service providers, search providers, financial institutions, universities, and other computing-intensive organizations often conduct computer operations from large scale computing facilities. Such computing facilities house and accommodate a large amount of server, network, and computer equipment to process, store, and exchange data as needed to carry out an organization's operations. Typically, a computer room of a computing facility includes many server racks. Each server rack, in turn, includes many servers and associated computer equipment.

Computer systems typically include a number of components that generate waste heat. Such components include printed circuit boards, mass storage devices, power supplies, and processors. For example, some computers with multiple processors may generate 250 watts of waste heat. Some known computer systems include a plurality of such larger, multiple-processor computers that are configured into rack-mounted components, and then are subsequently positioned within a racking system. Some known racking systems include 40 such rack-mounted components and such racking systems will therefore generate as much as 10 kilowatts of waste heat. Moreover, some known data centers include a plurality of such racking systems. Some known data centers include methods and apparatus that facilitate waste heat removal from a plurality of racking systems, typically by circulating air through one or more of the rack systems.

Many data centers rely on forced air systems and air conditioning to maintain the temperatures and other environmental conditions in the data center within acceptable limits. In one existing arrangement for a rack-based computer system, cooling air is introduced at the one end of a rack and expelled through the other end of the rack. In many systems, electrical connections for power and data are located the hot end of the rack system. With the electrical connections located at hot end of the rack, personnel may be forced to work in a hot environment to maintain the servers (for example, to connect and disconnect power and data cables).

BRIEF DESCRIPTION OF THE DRAWINGS

FIG. 4 illustrates one embodiment of a booth having adjustable flexible panels for controlling the size of an access opening in the booth.

FIG. 5 illustrates a front view of a booth having a set of horizontal slot openings with movable doors.

FIG. 6 illustrates a front view of a booth having a set of vertical slot openings with movable doors.

Figure 1:
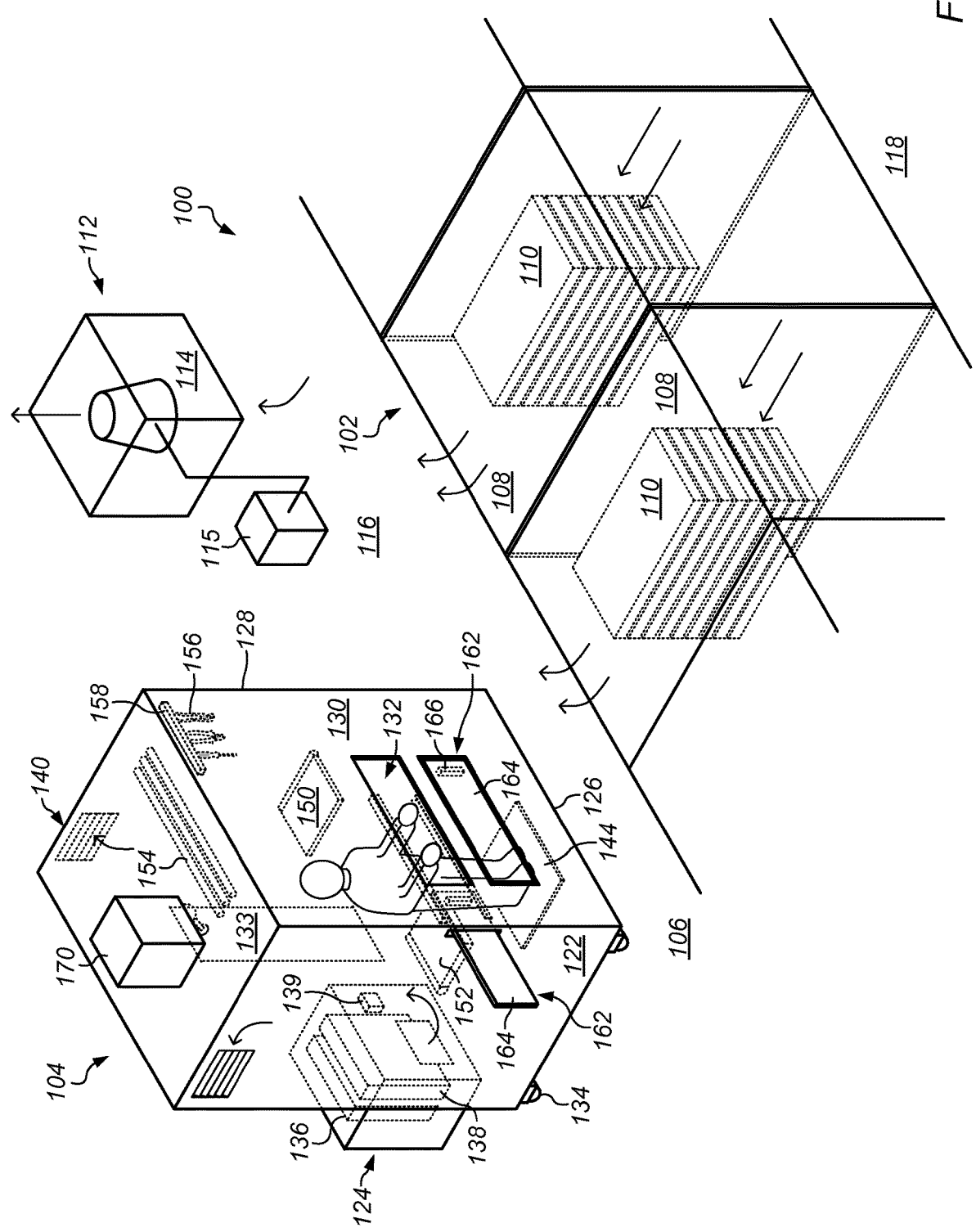
FIG. 1 illustrates one embodiment of a system having a booth for performing maintenance on servers in racks of a data center.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims. The headings used herein are for organizational purposes only and are not meant to be used to limit the scope of the description or the claims. As used throughout this application, the word "may" is used in a permissive sense (i.e., meaning having the potential to), rather than the mandatory sense (i.e., meaning must). Similarly, the words "include," "including," and "includes" mean including, but not limited to.

DETAILED DESCRIPTION OF EMBODIMENTS

Systems and methods for providing a controlled environment for performing operations are disclosed. According to one embodiment, a system includes a booth and an air moving system coupled to the booth. The booth includes an enclosure, an interior space that accommodates a person, and one or more openings. The openings are such that a person in the booth can access servers outside of the booth. The booth can be moved from one place to another relative to a floor. The air moving system cools air and moves the cooled air through the interior space of the booth.

According to one embodiment, a system includes one or more booths and an air moving system coupled to the booths. The booths may each include an enclosure, an interior space that accommodates a person, and one or more openings. The openings are such that a person in the booth can perform operations on a system or object outside the booth. The booth can be moved from one place to another relative to a floor. The air moving system cools air and moves the cooled air through the interior space of the booth.

According to one embodiment, a booth includes an enclosure, an interior space that accommodates a person, one or more openings, one or more air inlets, and one or more air exits. The air inlets can couple with an air moving system. The air exits can expel air out of the interior space of the booth. The booth can be moved from one place to another relative to a floor.

According to one embodiment, a method includes positioning a booth in front of a system or object to be worked on, and moving air through the booth. The booth includes one or more openings for a worker to reach the system or object while the worker is at least partially in the booth.

As used herein, an "operating environment", in the context of computing resources, means the space, facilities and infrastructure resources provided for the computing resources. An operating environment for a set of rack computing systems includes the space, power, data interchange, cooling, and environmental control resources provided for the set of computing systems.

As used herein, an "aisle" means a space next to one or more racks.

As used herein, "air handling system" means a system that provides or moves air to, or removes air from, one or more systems or components.

As used herein, "air moving device" includes any device, element, system, or combination thereof that can move air. Examples of air moving devices include fans, blowers, and compressed air systems.

As used herein, "ambient" refers to a condition of outside air at the location of a system or data center. An ambient temperature may be taken, for example, at or near an intake hood of an air handling system.

As used herein, "booth" means an enclosure that can accommodate one or more persons.

As used herein, a "cable" includes any cable, conduit, or line that carries one or more conductors and that is flexible over at least a portion of its length. A cable may include a connector portion, such as a plug, at one or more of its ends.

As used herein, a "cold aisle" means an aisle from which air can be drawn for use in removing heat from a system, such as a rack computing system.

As used herein, "computing" includes any operations that can be performed by a computer, such as computation, data storage, data retrieval, or communications.

As used herein, "computing device" includes any of various devices in which computing operations can be carried out, such as computer systems or components thereof. One example of a computing device is a rack-mounted server. As used herein, the term computing device is not limited to just those integrated circuits referred to in the art as a computer, but broadly refers to a processor, a server, a microcontroller, a microcomputer, a programmable logic controller (PLC), an application specific integrated circuit, and other programmable circuits, and these terms are used interchangeably herein. Some examples of computing devices include e-commerce servers, network devices, telecommunications equipment, medical equipment, electrical power management and control devices, and professional audio equipment (digital, analog, or combinations thereof). In various embodiments, memory may include, but is not limited to, a computer-readable medium, such as a random access memory (RAM). Alternatively, a compact disc-read only memory (CD-ROM), a magneto-optical disk (MOD), and/or a digital versatile disc (DVD) may also be used. Also, additional input channels may include computer peripherals associated with an operator interface such as a mouse and a keyboard. Alternatively, other computer peripherals may also be used that may include, for example, a scanner. Furthermore, in the some embodiments, additional output channels may include an operator interface monitor and/or a printer.

As used herein, "data center" includes any facility or portion of a facility in which computer operations are carried out. A data center may include servers dedicated to specific functions or serving multiple functions. Examples of computer operations include information processing, communications, simulations, and operational control.

As used herein, "evaporative cooling" means cooling of air by evaporation of liquid.

As used herein, a "hot aisle" means an aisle into which heated air can be discharged for use in removing heat from a system, such as a rack computing system.

As used herein, "mechanical cooling" means cooling of air by a process that involves doing mechanical work on at least one fluid, such as occurs in vapor-compression refrigeration systems.

As used herein, a "module" is a component or a combination of components physically coupled to one another. A module may include functional elements and systems, such as computer systems, circuit boards, racks, blowers, ducts, and power distribution units, as well as structural elements, such a base, frame, housing, or container.

As used herein, "power distribution unit" refers to any device, module, component, or a combination thereof, that can be used to distribute electrical power. The elements of a power distribution unit may be embodied within a single component or assembly (such as a transformer and a rack power distribution unit housed in a common enclosure), or may be distributed among two or more components or assemblies (such as a transformer and a rack power distribution unit each housed in separate enclosure, and associated cables, etc.)

As used herein, "rack computing systems" means a computing system that includes one or more computing devices mounted in a rack.

As used herein, "room" means a room or a space of a building. As used herein, "computer room" means a room of a building in which computing devices, such as rack-mounted servers, are operated.

As used herein, a "space" means a space, area or volume.

In some embodiments, a system includes one or more movable booths, and an air moving system that moves air through interior space of the booths. The booths have openings for performing operations on systems outside the booth. In certain embodiments, a booth has openings for performing operations (such as configuration or maintenance) on rack servers.

FIG. 1 illustrates one embodiment of a system having a booth for performing maintenance on servers in racks of a data center. Data center 100 includes rack computing systems 102 and rack maintenance system 104 in computing room 106. Rack computing systems 102 include racks 108 and servers 110.

In some embodiments, a data center includes an air removal system that creates a negative pressure in a hot aisle to pull air through computing devices in the data center. In some embodiments, a data center includes pods of rack computing systems arranged in one or more rows and columns.

Data center 100 includes computing room air handling unit 112. Computing room air handling unit 112 may move air through computing room 106 and rack computing systems 102. Computing room air handling unit 112 includes one or more air moving devices 114. Air moving devices 114 may draw air from hot aisle 116, creating a negative pressure relative to cold aisle 118. Air may move from cold aisle 118 to hot aisle 116 through servers 110 in racks 108. Heat from heat producing components in servers 110 may be rejected into the air as it passes through the servers. As such, the air at the front of racks 108 may be substantially above normal room temperatures.

Control system 115 may be coupled to air moving devices 114 by way of variable frequency drives (VFDs). Each of the VFDs may receive control signals from the control system and subsequently modulate a rotational velocity of a fan in one or more air moving devices 114. Air moving devices 114 draw air from cold aisle 118, through servers in rack computing systems 106, and into hot aisle 116. Air moving devices 114 may expel air from hot aisle 116 into an exhaust plenum.

In some embodiments, elements of an air removal system may be shared among two or more pods in a data center. Exhaust fans for computing devices in two or more pods may feed into a common exhaust plenum above the exhaust fans.

Air may be introduced into cold aisle 118 from a mixing plenum. The mixing plenum may receive outside air, recirculated air, or a combination of both. Outside air may be received through outside an air intake penthouse, for example. Air received through the outside air intake penthouse may be channeled to outside air plenums.

Rack maintenance system 104 may be used to provide personnel working on servers in racks with an environmentally controlled workspace. Rack maintenance system 104 includes booth 122, booth air moving system 124, and base 126. Booth air moving system 124 is mounted on booth 122. Booth 122 includes enclosure 128 and interior space 130. Openings 132 are included in the walls of enclosure 128. Interior space 130 may accommodate a person, such as a server maintenance worker. User access door 133 is provided on enclosure 128.

Base 126 includes rollers 134. Rack maintenance system 114 may be moved on rollers 134 from one location to another on the floor of computing room 106. In some embodiments, base 126 is motorized. Rack maintenance system 114 may be positioned in front of one of rack computing system 102 so that maintenance can be performed on servers in the rack computing system.

Booth air moving system 124 includes air moving device 136, booth air cooling unit 138, and booth air control system 139. Air moving device 136 may be a fan. Cooling unit 138 may be an air conditioning unit. Air moving device 136 may draw air from computing room 106 and move air through cooling unit 138. Air from cooling unit 138 may be supplied to interior space 130 of booth 122. Air in interior space 130 may be at a higher pressure than air outside of booth 122. Air in interior space 130 may be vented to hot aisle 116 by way of vents 140.

Booth air moving system 124 may be operated to maintain air in interior space 130 of booth 122 with predetermined limits. Booth air moving system 124 may, for example, maintain temperatures in booth 122 below a predetermined maximum temperature, such as 90 degrees F. In some embodiments, booth air moving system 124 includes a thermostat. The thermostat may be set to maintain air temperatures with booth 122 within a predetermined range, such as between 68 degrees F. and 74 degrees F.

Booth air moving system 124 may be connected to activation pad 144. Activation pad 144 may include a switch that closes when a person stands on activation pad 144. Air moving device 136 and/or or cooling unit 138 may be activated when a person stands on activation pad 144.

Cooling unit 138 may include a refrigerant-based air conditioning unit, an evaporative cooling unit, or both. In some embodiments, a rack maintenance system includes a heater instead of, or in addition to, a cooling unit. The heater may be activated to maintain temperatures in the interior space of a booth above a predetermined minimum temperature, such as 68 degrees. In some embodiments, a system controls other characteristics of air in a booth, such as a humidity or pressure.

In certain embodiments, a portion of the air in the interior space of a booth is recirculated through a booth air moving system. The air moving system may include a mixing plenum that mixes recirculated air from inside the booth with fresh air coming from outside the rack maintenance system.

Booth 122 may serve as a workstation for performing operations to configure or maintain rack computing systems in a data center. Booth 122 includes work tray 150, seat 152, lights 154, and tools 156.

Work tray 150 and seat 152 may be adjustable relative to the interior walls of enclosure 128. In one embodiment, work tray 150 and seat 152 are mounted on hinges so that they can be folded up when not in use). In certain embodiments, a work tray and/or seat can slide relative to an enclosure of a booth (for example, on a set of rails). A work tray can slide in or out, up or down, or combinations thereof.

In some embodiments, a work tray includes a power lift mechanism. The power lift mechanism may be operated to position a tray for use in a maintaining or configuring a rack computing system. The power lift mechanism may be operated, for example, to move a tray to an appropriate height to support a server, or extend a tray into and out of a rack.

Tools 156 are held on tool bar 158. In some embodiments, tools 156 are tethered to tool bar 158. The tethers may be retractable (for example, by a tether on a spring-loaded spool).

Lights 154 may illuminate items while work is being performed by a person in booth 122. In some embodiments, lights 154 are adjustable in direction, intensity, or both. In certain embodiments, lighting on or in a booth can be adjusted to illuminate objects in the interior of a rack.

Openings 132 enable access by a person in booth 122 to servers 110 in racks 108. Booth 122 includes a door 162 over each of openings 132. Doors 162 include panel 164 and handle 166. Doors 162 may be adjustable by a user inside booth 122 to create access through selected openings 132. Doors 162 may be adjustable to increase or decrease the size of an opening in a booth. Closing doors of a booth may help maintain air pressure in the interior space of a booth.

Although openings are enclosed by sliding doors, an opening in a booth may, in various embodiments, be closed or reduced by any of various other types of panels, covers, or plugs. In certain embodiments, a door for an opening is hinged relative to the opening. In certain embodiments, openings in a booth are covered by stand-alone panels or covers.

Operation of a booth air moving system may be controlled in response to one or more conditions. For example, booth air control system 139 may be programmed to increase the speed of air moving device 136 when one or more predetermined conditions, such as a maximum temperature, are met.

In certain embodiments, a control unit for a booth air moving system includes at least one programmable logic controller. The PLC may, among other things, regulate air moving devices and open and close valves or dampers in cooling air systems based upon command signals from an operator to channel air flow as necessary for the prevailing operational conditions. Alternatively, the PLC may modulate valves and dampers between fully open and fully closed positions to modulate airflow.

A control system may include temperature measurement devices that are, in one embodiment, thermocouples. Alternatively, the temperature measurement devices include, but are not limited to, resistance temperature detectors (RTDs) and any device that facilitate cooling operation as described herein. For example, a thermocouple may be positioned within mixing plenum to facilitate measuring a temperature of the air the mixing plenum.

Although only two openings 132 are shown in FIG. 1, a booth may have any number of openings and any number of panels for covering the openings, and in any arrangement. In some embodiments, openings in a booth are in the form of slots that correspond to slots and/or servers in a rack. Openings may be provided over the full height of the booth.

Tray 150 and seat 152 may be retractable. For example, tray 150 and seat 152 may fold up and/or slide into a stowed position in the wall of enclosure 128.

In some embodiments, a maintenance system includes a fire suppression device. The fire suppression device may be mounted on a booth of the maintenance system. The fire suppression device may include a reservoir that holds a fire suppression material. The fire suppression material may be released into or onto the booth in response to a fire condition. In certain embodiments, a fire suppression device on a booth dispenses fire suppression material onto or into a rack computing system.

Rack maintenance system 104 includes fire suppression device 170. Fire suppression device 170 may suppress fire on or in booth 122, or in elements or systems around the booth. In some embodiments, fire suppression device 170 includes a reservoir holding fire suppression material. In some embodiments, fire suppression device 170 draws fire suppression material through lines or pipes outside of booth 130.

In some embodiments, a fire suppression system is activated in response to fire conditions. For example, a thermal fuse may trigger when the temperature at the location of the fuse reaches a predetermined temperature. In one embodiment, thermal fuse includes a material that melts at a predetermined temperature. Once a thermal fuse has been triggered for one of the dispensing devices, a fire suppression material may be dispensed through a spray tip of that dispensing device. In certain embodiments, when the fire suppression device for a booth is activated, the air moving system, auxiliary power supply, or both for the booth are shut down.

In various embodiments, fire suppression material may be any suitable material that can be drawn from a reservoir, container, or vessel. Fire suppression material may be a liquid, a solid, or a gas, or a combination thereof. In certain embodiments, a fire suppression material is a powder.

Figure 2:
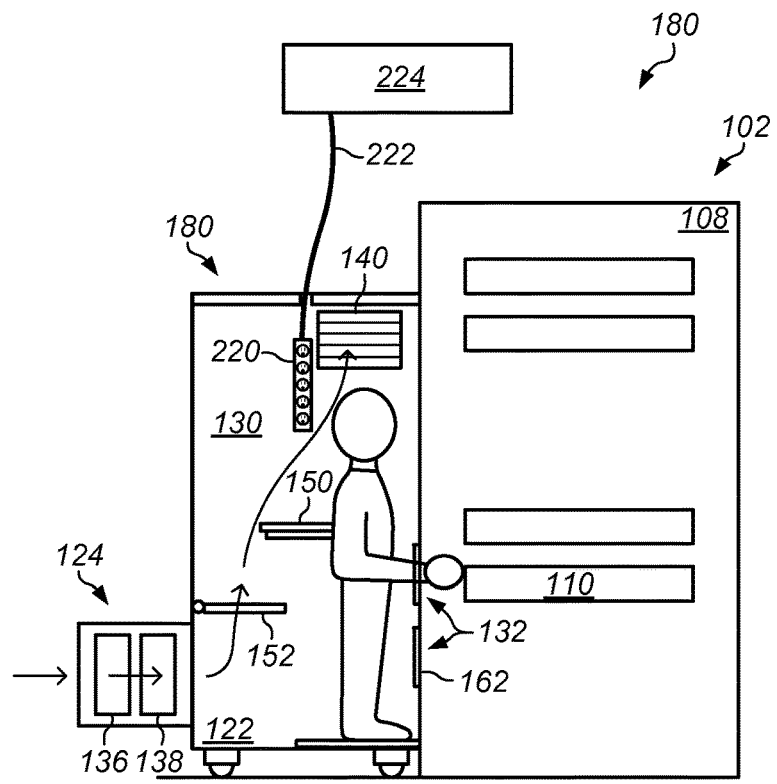
FIG. 2 is a side view illustrating one embodiment of a temperature controlled booth positioned in front of a rack computing system.

FIG. 2 is a side view illustrating one embodiment of a temperature controlled booth positioned in front of a rack computing system. Data center 180 includes rack computing systems 102 and maintenance system 104. Booth 122 of maintenance system 104 may be rolled in front of rack 108 of rack computing system 102. With booth 122 positioned next to rack 108, a maintenance worker in booth 122 may access servers 110 in rack 108 by way of openings 132. The maintenance worker may selectively open doors 162 on booth 122. The maintenance worker may open doors only as necessary to access the particular server or servers to be maintained.

In some embodiments, a seal may be formed between rack 108 and booth 122. The seal may create joint container including interior space 130 of booth 122 and the interior of rack 108. In some embodiments, one or more seal members, such as an elastomeric gasket, are provided at a junction between booth 122 and rack 108.

Air moving system 124 may supply air to interior space 130 of booth 122. Air moving system 124 may be operated to control environmental conditions in interior space 130, such as temperature and humidity. Air in interior space 130 may be vented through vents 140.

Figure 3:
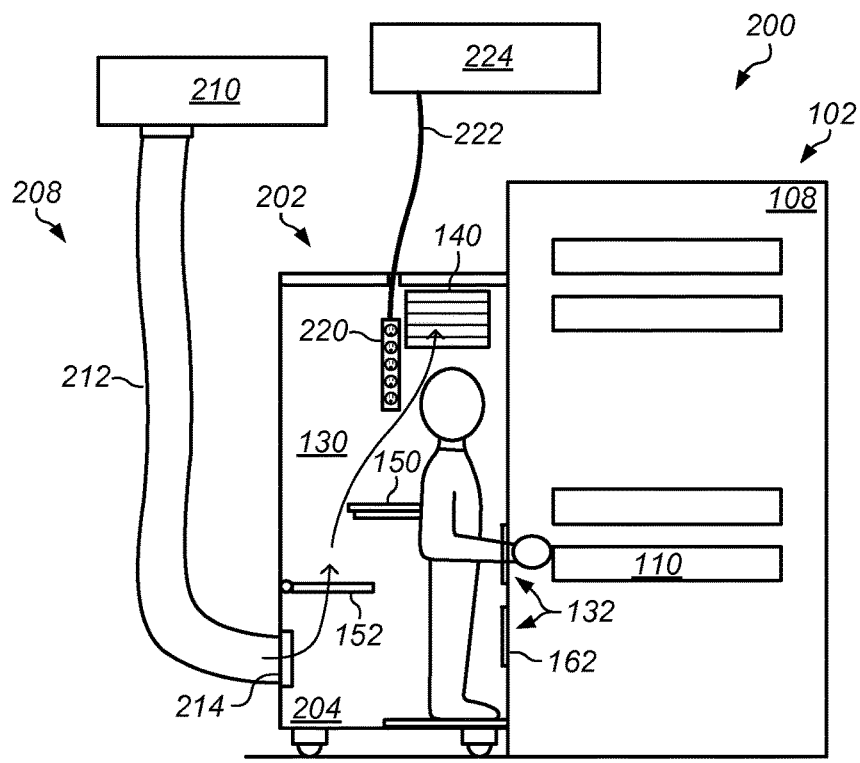
FIG. 3 is a side view illustrating one embodiment of a temperature controlled booth that receives air from a remote air moving system by way of a flexible duct.

In some embodiments, a temperature-controlled booth receives air from a remote air moving system (for example, by way of a duct). FIG. 3 is a side view illustrating one embodiment of a temperature controlled booth that receives air from an air moving system by way of a flexible duct. Data center 200 includes rack computing systems 102 and maintenance system 202. Booth 204 of maintenance system 202 may be rolled in front of rack 108 of rack computing system 106. With booth 204 positioned next to rack 108, a maintenance worker in booth 122 may access servers 110 in rack 108 by way of openings 132.

Air moving system 208 includes air handling system 210 and flexible hose 212. One end of flexible hose 212 is coupled to air inlet opening 214 on booth 204. The other end of flexible hose 212 is coupled to air handling system 210. Air handling system 210 may supply air to interior space 130 of booth 204. Air moving system 204 may be operated to control environmental conditions in interior space 130 such as temperature and humidity. Air in interior space 130 may be expelled through vents 140.

In some embodiments, a maintenance system includes a power supply system. For example, in FIG. 3, system 202 includes power distribution unit 220. Power distribution unit 220 may be attached to a wall on the interior of enclosure 226 of booth 204. Power to power distribution unit 220 may be fed on cable 222. Cable 222 may be fed through an opening in enclosure 226. Cable 222 may transmit power from power source 224 to power distribution unit 220. In certain embodiments, power distribution unit 220 may be retractable. For example, cable 222 may be on a spring-loaded take-up reel.

In some embodiments, the size of an opening in a booth for performing operations is adjustable in size. FIG. 4 illustrates one embodiment of a booth having adjustable flexible panels for controlling the size of an access opening in the booth. Rack maintenance system 240 includes booth 242 and air moving system 124. Air moving system 124 can move air through interior space 130 of booth 242. Booth 242 includes enclosure 244, upper flexible panel 246, and lower flexible panel 248. In some embodiments, upper flexible panel 246 and lower flexible panel 248 have a roll top-type, segmented construction. Upper flexible panel 246 and lower flexible panel 248 include handles 250.

Upper flexible panel 246 and lower flexible panel 248 are adjustable by a user in booth 242 to control the size and position of opening 252. For example, by raising upper flexible panel 246 and lowering lower flexible panel 248, the size of opening 252 is increased. As another example, by raising upper flexible panel 246 and the lower flexible panel 248 by the same amount, the location of opening 252 is moved up without increasing the size of opening 252.

In some embodiments, a lock mechanism is included on doors or covers of a booth. For example, in the embodiment shown in FIG. 4, lock devices 254 may be used to lock panels 246 and 248 in a desired position.

FIG. 5 illustrates a front view of a booth having a set of horizontal slot openings with movable doors. Booth 260 includes aperture 262 and doors 264. Doors 264 may be positioned to create openings 266. In one embodiment, doors 264 can be positioned to create one or more openings having a standard height, such as 1 rack unit (1U).

FIG. 6 illustrates a front view of a booth having a set of vertical slot openings with movable doors. Booth 270 includes apertures 272 and doors 274 on rails 276. Doors 274 may be positioned to create openings 276. Openings may be created, for example, to allow access to a blade server in a rack. In one embodiment, doors 274 can be positioned to create one or more openings having a standard width, such as 1 rack unit (1U).

Figure 7A:
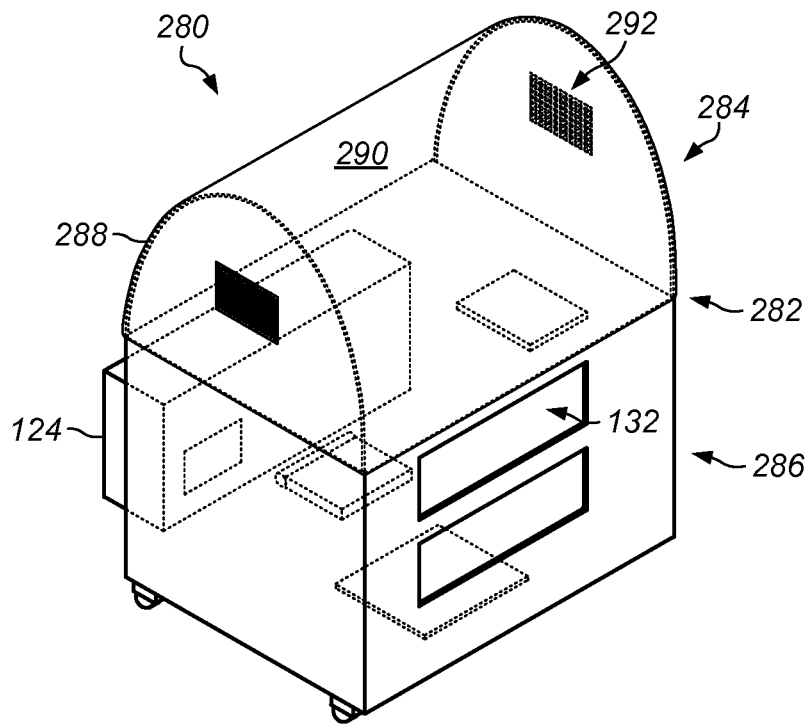
FIG. 7A illustrates one embodiment of a booth with a collapsible upper section.
Figure 7B:
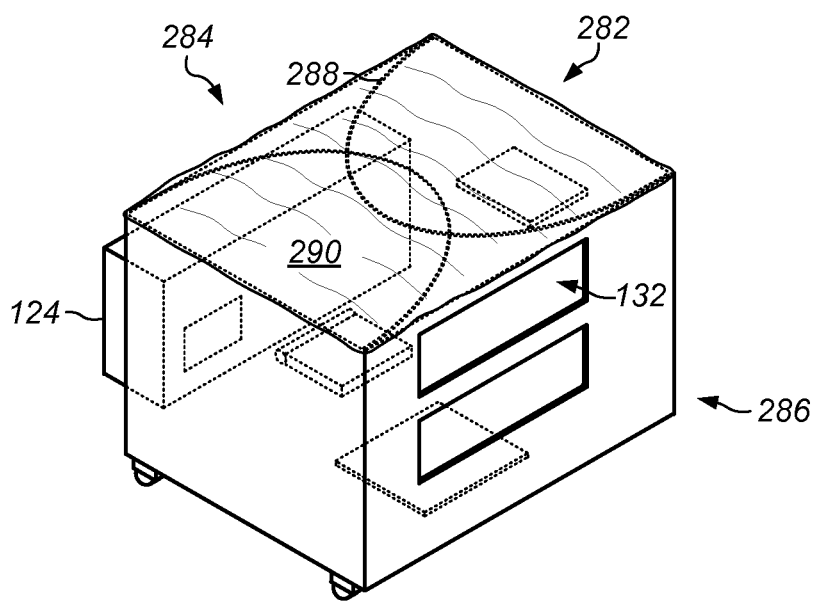
FIG. 7B illustrates one embodiment of a booth with an upper section in a collapsed state.

In some embodiments, some or all of an enclosure is collapsible. FIG. 7A illustrates one embodiment of a booth with a collapsible upper section. FIG. 7B illustrates one embodiment of a booth with an upper section collapsed. Rack maintenance system 280 includes booth 282 and air moving system 124. Booth 282 includes upper section 284 and lower section 286. Upper section 284 may be collapsible. Upper section 284 of booth 282 includes frame members 288, walls 290, and exhaust vents 292. Walls 290 may be made of a fabric. Frame members 288 may fold down (for example, such that frame members 288 lie in a plane at the top of lower section 286. In certain embodiments, frame members of a booth are bendable to fold down or a collapse a portion of a booth.

In some embodiments, portions of a booth enclosure are made of flexible or pliable material, such as foil or cloth. In one embodiment illustrated in FIGS. 7A and 7B, for example, walls 290 may be made of fabric. Examples of suitable materials for a fabric may include a polyester, nylon, or cotton weave of yarn or filaments. In certain embodiments, cloth or fabric portions of a duct may be attached a frame or base of a booth (or to an intermediate frame) by way of hook and loop, snaps, screws, clips, or other fasteners.

Figure 8:
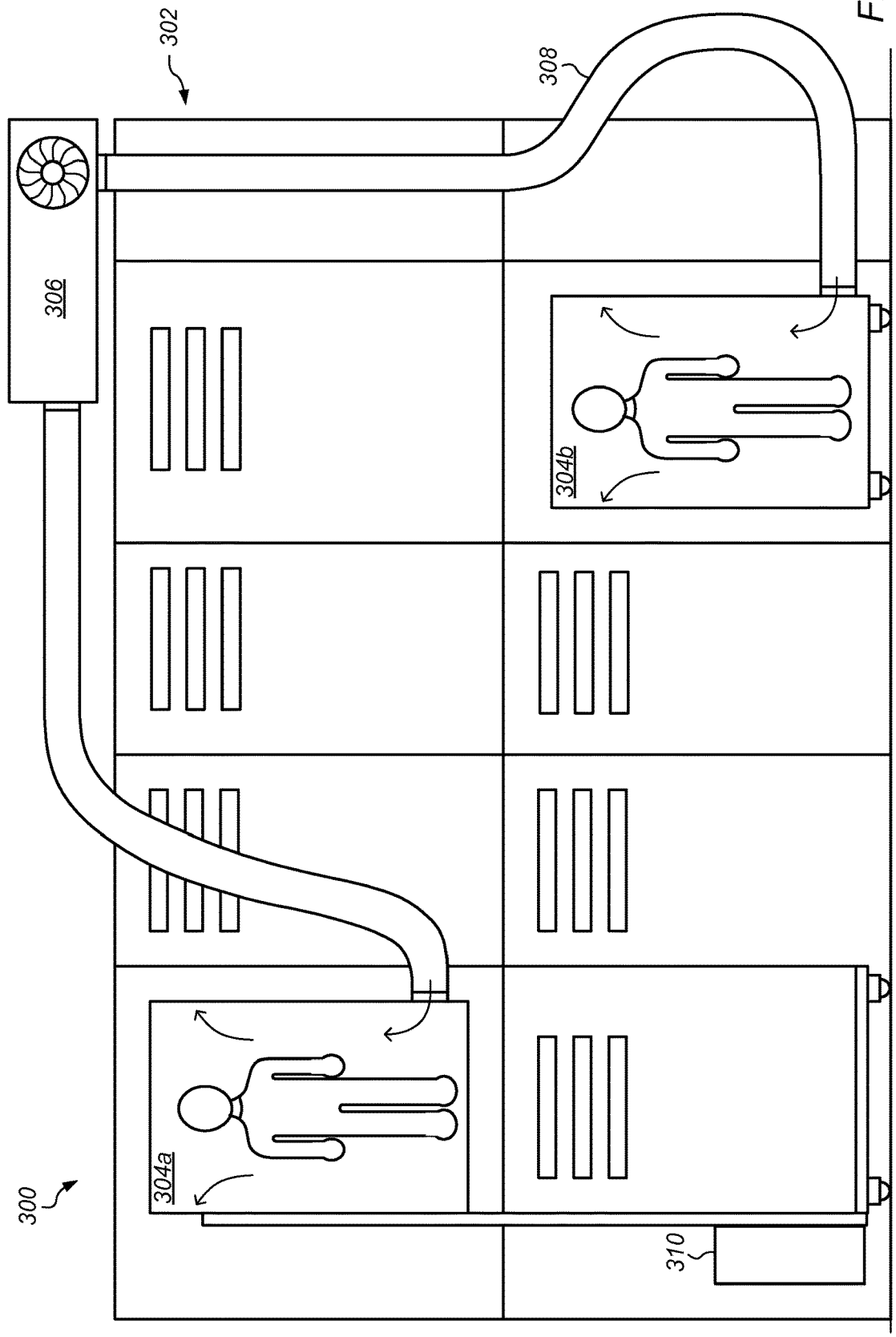
FIG. 8 illustrates one embodiment of a data center including a rack maintenance system with a lift mechanism for raising a booth to a second level of racks.

In some embodiments, a maintenance system includes a powered mechanism for positioning an environmentally controlled booth. FIG. 8 illustrates one embodiment of a data center including a rack maintenance system with a lift mechanism for raising a booth to a second level of racks.

Data center 300 includes rack computing systems 102 and rack maintenance system 302. Rack computing systems 102 are in a multi-level arrangement. Rack maintenance system 302 includes booth 304a, booth 304b, air moving system 306, and flexible hoses 308. Flexible hoses 308 may carry air from air moving system 306 to booths 304a and 304b. Air moving system 306 may supply air to booth 304a and booth 304b to controlling conditions in the interior spaces of the booths (for example, the temperature in the booths). Booth 304a is carried on lift system 310. Lift system 310 is, in one embodiment, a vertical mast lift system. In some embodiments, lift system 310 is self-propelled. A driver may operate lift system 310 to position booth 304a in front a rack to be worked on. In the data center shown in FIG. 8, lift system 310 may be operated to raise booth 304a to be elevated to the second level of rack computing systems 102.

In some embodiments, a system includes a motorized system for moving the maintenance an environmentally controlled booth from one place to another. In some embodiments, the motorized system is battery-powered. In certain embodiments, the system includes a walkie or automatic guided vehicle ("AGV"). The walkie or AGV may be used to move booths from place to place on the floor of a facility.

In the embodiment shown in FIG. 8, two booths are supplied with air from a single air moving system. An air moving system may, nevertheless, in various embodiments supply air to any number of booths. In certain embodiments, one or more booths of a maintenance system tap air from an air moving system for other systems or portions of a facility. For example, a maintenance system may tap air supplied from an air handling unit or computer room air conditioning (CRAC) unit for a computer room or pod.

Figure 9A:
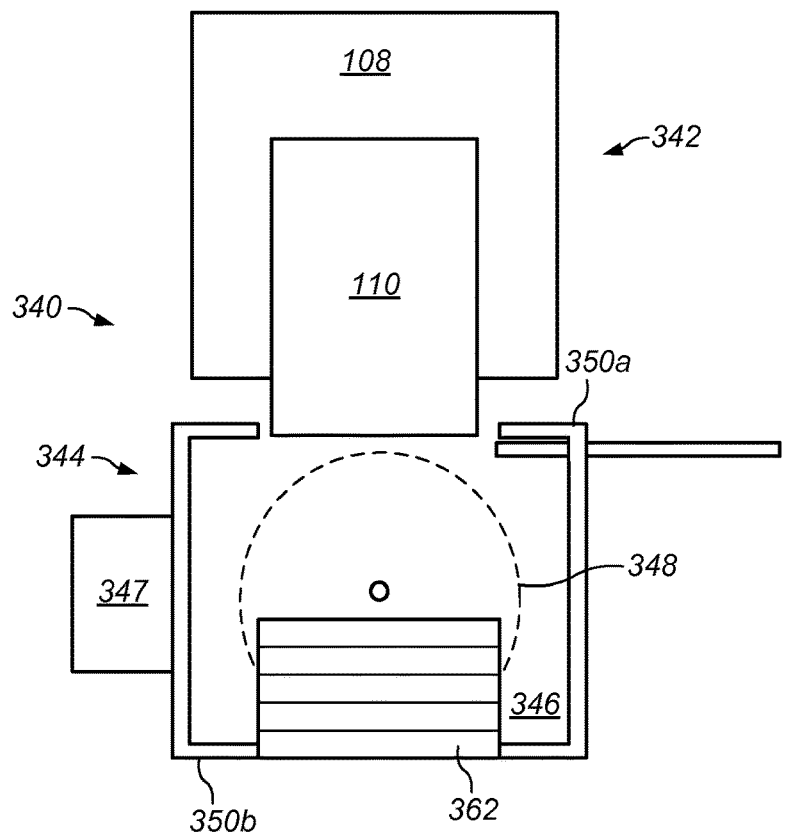
FIGS. 9A and 9B illustrate one embodiment of a data center including a booth with sides having different opening arrangements.
Figure 9B:
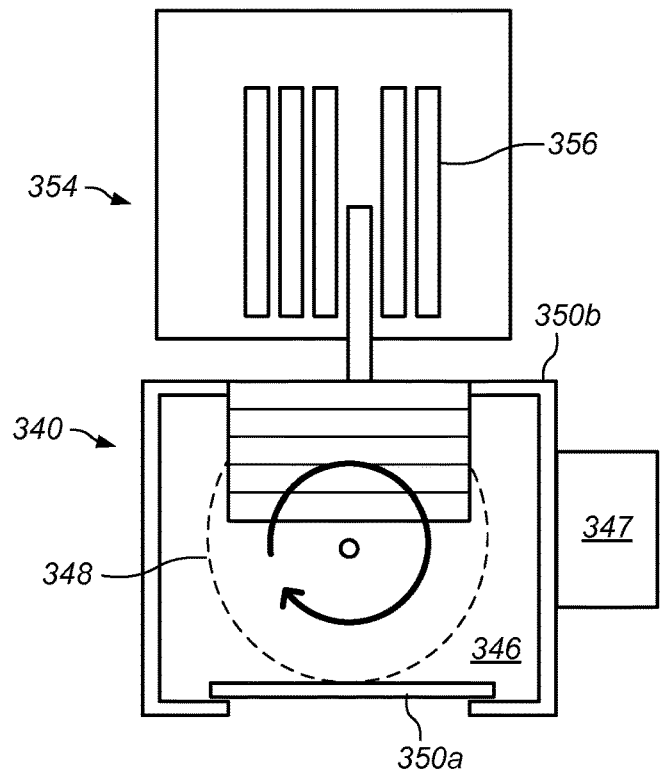

In some embodiments, an environmentally controlled booth has two or more sides, each having a different arrangement of openings. The different arrangements of the openings may be used to perform different types of operations, or to perform operations on systems having different configurations (for example, horizontally oriented computing devices versus vertically oriented computing devices). FIGS. 9A and 9B illustrate one embodiment of a data center having a booth with sides having different opening arrangements. Data center 340 includes rack computing system 342 and rack maintenance system 344. Rack maintenance system 344 includes booth 346, air moving system 347, and rotating platform 348. Enclosure 346 includes side 350a and side 350b. Side 350a includes openings 132 and sliding doors 162. Openings 132 and sliding doors 162 may be similar to those described above relative to FIG. 1. Side 350b includes doors 362. Doors 362 may be similar to doors 246 and 248 described above relative to FIG. 4. Rotating platform 348 may be used to rotate booth 346 about a vertical axis. Booth 346 may be rotated to present a different side of booth 346 to a rack. For example, FIG. 9b shows rotation of booth 346 to present side 350b to rack computing system 354. Rack computing system 354 includes blade servers 356. Doors 362 may be adjusted to increase the size of an opening in side 350b. The opening may be increased to a size, for example, that allows maintenance personnel in booth 346 to remove and replace blade servers.

In some embodiments, openings on one side of a booth can be used for egress from booth. For example, referring to FIG. 9A, if a fire or other hazardous condition developed in rack 108, the operator could exit booth 346 by openings in doors 362 on the side 550b opposing rack 108.

Figure 10A:
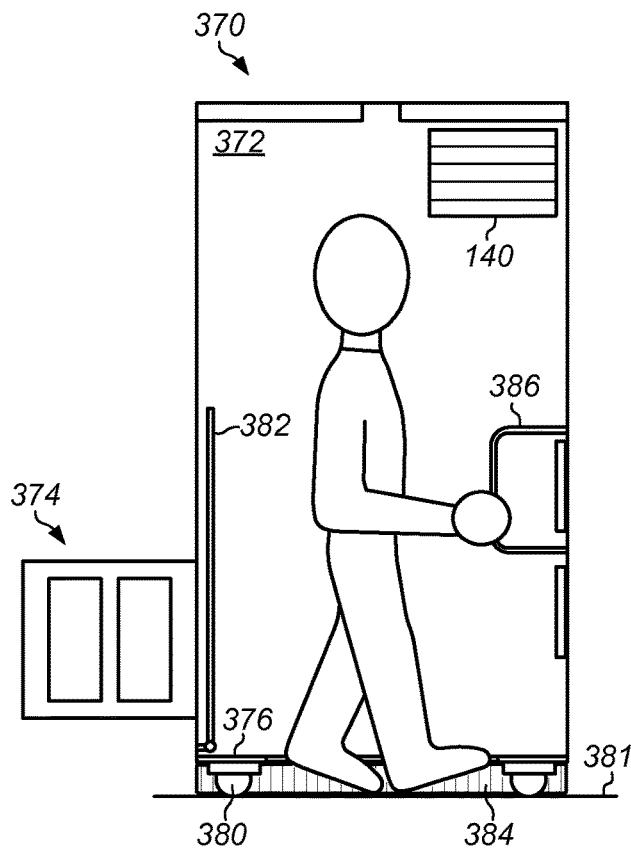
FIG. 10A and FIG. 10B illustrate one embodiment of a booth having an open bottom.
Figure 10B:
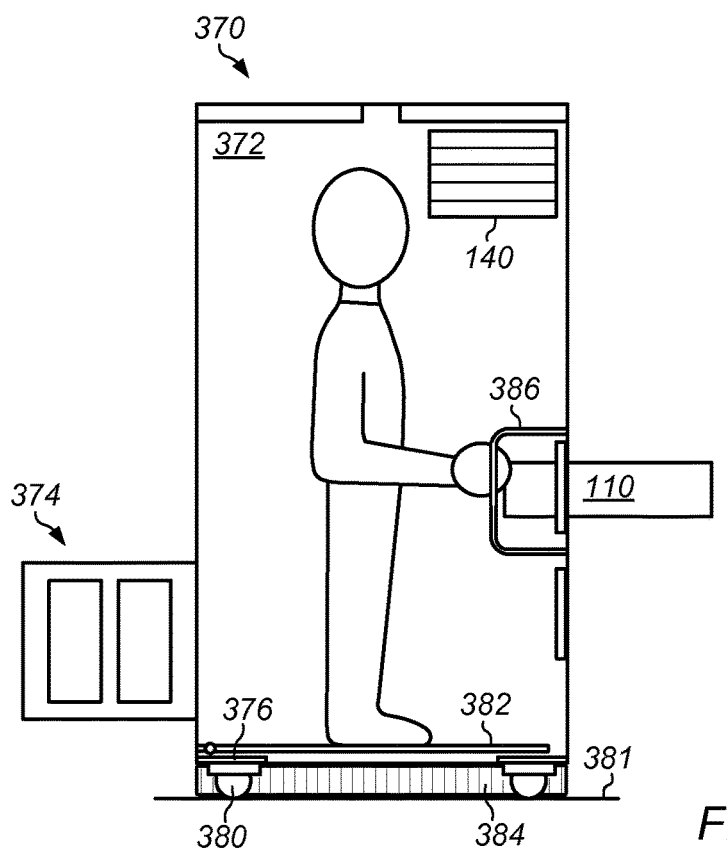
Figure 11:
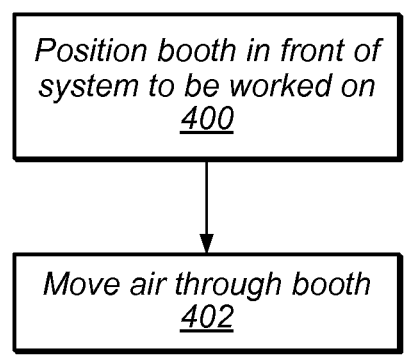
FIG. 11 illustrates one embodiment of providing an environment for performing operations on a system.

In some embodiments, a person in an environmentally controlled booth can move the booth from one location on the floor to another while the person is at least partially inside the booth. FIG. 10A and FIG. 10B illustrate one embodiment of a booth having an open bottom. Maintenance system 370 includes booth 372 and air moving system 374. Booth 372 includes bottom rim 376, bottom opening 378, rollers 380, platform 382, skirt 384, and handle 386. Rollers 380 are mounted on bottom rim 376.

As illustrated in FIG. 10A, the person in the booth may walk booth 372 from one location to another on the floor. The person may grasp handles 386 as an aid to pushing or pulling the booth to the desired location. Bottom opening 378 may be large enough for the person's legs to extend through to floor 381.

Skirt 380 may run along the perimeter of booth 372. Skirt 380 may hang from the bottom of the booth enclosure and extend part or all of the way to the floor. Skirt 380 may reduce leakage of air from the interior of booth 372 to the space outside the booth.

Once maintenance system 370 is in position, platform 382 may be folded down to be mountable by the person in the booth. Air moving system 374 may be activated to move air through the interior of booth 372. In some embodiments, platform 382 includes a mechanism for activating air moving system 374. For example, an air moving device may be turned on when platform 382 is folded down into a horizontal position, or when the person stands on the platform.

FIG. 110 illustrates one embodiment of providing an environment for performing operations on a system. At 400, a booth is positioned in front of a system to be worked on. The booth may include openings for a worker to reach the system to be worked on while the worker is in the booth. In some embodiments, the worker positions the booth on the floor by walking the booth from one location to another, such as described above relative to FIG. 10A. In other embodiments, an operate may drive a powered device, such as a motorized cart, to position the booth on the floor.

At 402, air is moved through the booth. Air flow through the booth may be used to maintain environmental conditions in the booth within acceptable limits for a user in the booth.

Air may be used to maintain the air temperature in the booth at or below a predetermined maximum temperature (for example, 74 degrees F.).

Once the booth is in position, the worker may perform operations on items outside the booth (for example, server maintenance on servers). In certain embodiments, a worker's arms, legs, or both partially extend from the booth during operations. In some embodiments, the item remains outside the booth during the operations. For example, the person may connect cables to a server while the server remains fully installed in a rack. In some embodiments, the item may be partially or fully drawn into the booth to be worked on.

In many embodiments described above, the booth system has been described for use in performing configuration or maintenance of systems in a data center, such as rack-mounted servers. A system having an environmentally controlled booth may, nevertheless, in various embodiments be used for performing other operations, and in other environments. Examples of environments for environmentally-controlled booth include a warehouse, a factory, an office building, a ship, or the outdoors. Examples of other operations performed from an environmentally-controlled booth include painting, powder coating, welding, industrial processing, product assembly, construction, landscaping, and building maintenance.

In various embodiments, booths may be made of any suitable material. In some embodiments, a booth enclosure includes thermal insulation. Material for a booth may be flame-retardant. In some embodiments, a booth includes fire suppression panels. In certain embodiments, a booth includes a fire suppression device, such as a fire extinguisher.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A data center, comprising:
   a plurality of racks;
   a plurality of computing devices mounted in the racks;
   a hot aisle, wherein the computing devices mounted in the racks reject heat into the hot aisle; and
   a temperature-controlled mobile rack maintenance system configured to enable a person to perform maintenance in the hot aisle, while the computing devices are rejecting heat into the hot aisle, the temperature-controlled rack maintenance system comprising:
      a mobile booth configured to move from one place to another within the hot aisle, wherein the mobile booth comprises:
         an enclosure;
         one or more rollers coupled to the enclosure;
         an interior space configured to accommodate the person;
         one or more openings; and
         one or more panels, wherein at least one of the panels is configured to slide relative to at least one of the one or more openings and be positioned such that the at least one opening remains open while the person in the mobile booth reaches into and out of the at least one opening to install or remove a computing device in at least one of the racks from a location in the hot aisle; and
      an air moving system coupled to the mobile booth, wherein the air moving system is configured to cool air and move at least a portion of the cooled air through at least a portion of the interior space of the mobile booth to control the interior space of the mobile booth within environmental condition limits separate from environmental conditions of the hot aisle.

2. The facility of claim 1, wherein a size of at least one of the one or more openings is adjustable by the person in the mobile booth, wherein the one or more panels are configured to maintain an adjusted opening size while the person in the mobile booth reaches into and out of the at least one opening.

3. The facility of claim 1, wherein the air moving system is mounted on the mobile booth.

4. The facility of claim 1, further comprising one or more ducts configured to supply cooled air from the air moving system to the mobile booth.

5. A data center, comprising:
   a plurality of racks;
   a plurality of computing devices mounted in the racks;
   one or more aisles adjacent to the plurality of racks, wherein the computing devices reject heat into the one or more aisles; and
   a temperature-controlled mobile rack maintenance system configured to enable one or more people to perform maintenance in the one or more aisles, while the computing devices are rejecting heat into the one or more aisles, the temperature-controlled rack maintenance system comprising:
      one or more mobile booths configured to move from one place to another within the one or more aisles, wherein at least one of the one or more mobile booths comprises:
         an enclosure;
         one or more rollers coupled to the enclosure;
         an interior space configured to accommodate a person;
         one or more openings; and
         one or more panels, wherein at least one of the panels is configured to slide relative to at least one of the one or more openings and be positioned such that the at least one opening remains open while a person in the mobile booth reaches into and out of the at least one opening such that the person can perform operations on a particular system or object outside the mobile booth, wherein the particular system or object to be worked on comprises one or more of the computing devices mounted in one or more of the racks, wherein the one or more openings allow the person in the mobile booth to install and remove the one or more computing devices in the one or more racks; and
      an air moving system coupled to at least one of the one or more mobile booths, wherein the air moving system is configured to move air through at least a portion of the interior space of the at least one mobile booth to control the interior space of the at least one mobile booth within environmental condition limits separate from environmental conditions within the one or more aisles.

6. The system of claim 5, wherein, for at least one of the one or more mobile booths, a size of at least one of the one or more openings is adjustable by the person in the mobile booth, wherein the one or more panels are configured to maintain an adjusted opening size while the person in the mobile booth reaches into and out of the at least one opening.

7. The system of claim 5, wherein, for at least one of the one or more mobile booths, the air moving system is mounted on the mobile booth.

8. The system of claim 5, further comprising one or more ducts configured to supply air from the air moving system to at least one of the one or more mobile booths.

9. The system of claim 5, wherein the system comprises a plurality of mobile booths, and wherein the system further comprises one or more ducts configured to supply air from the air moving system to at least two of the plurality of mobile booths.

10. The system of claim 5, wherein the air moving system is configured to maintain air in at least a portion of the at least one mobile booth at or below a predetermined temperature.

11. The system of claim 5, wherein the air moving system is configured to supply air at a lower temperature than a temperature outside of the at least one mobile booth.

12. The system of claim 5, wherein the air moving system is configured to supply air at a higher temperature than a temperature outside of the at least one mobile booth.

13. The system of claim 5, wherein the computing devices mounted in the rack comprise one or more servers, and wherein at least one of the openings is configured such that the person in the mobile booth can gain access to the one or more servers outside of the mobile booth.

14. The system of claim 5, wherein the one or more panels are operable by a user the person in the at least one mobile booth to close at least one of the one or more openings.

15. The system of claim 5, wherein the one or more panels are operable by a user the person in the at least one mobile booth to increase or decrease a size of the at least one of the one or more openings.

16. The system of claim 5, wherein at least one of the one or more mobile booths comprises:
a first side comprising a first set of one or more openings; and
a second side comprising a second set of one or more openings,
wherein the first set of openings has a different arrangement from the second set of openings.

17. The system of claim 16, wherein the at least one mobile booth comprises a rotating platform that rotates about a vertical axis, wherein the rotating platform configured to change the side of the mobile booth facing a rack from the first side to the second side.

18. The system of claim 5, wherein at least one of the one or more mobile booths comprises a platform, wherein the platform comprises an air activation device, wherein the air activation device is configured to activate moving air through the at least one mobile booth when the platform is stepped on by the person.

19. The system of claim 5, wherein at least one of the mobile booths comprises:
an opening to a floor of the aisle, wherein the opening is configured such that the person in the at least one mobile booth can walk the mobile booth from one location to another on the floor; and
a folding platform configured to fold down to at least partially cover the opening, wherein folding the folding platform to at least partially cover the opening causes the air moving system to be activated.

20. The system of claim 5, wherein at least one of the one or more mobile booths comprises a lift mechanism configured to raise and lower the at least one mobile booth relative to a floor of the aisle.

21. The system of claim 5, wherein at least one of the one or more mobile booths comprises a work tray configured to support one or more servers.

22. The system of claim 5, wherein an enclosure for at least one of the mobile booths is at least partially collapsible.

23. The system of claim 5, further comprising a fire suppression device configured to at least partially suppress a fire in the system in response to one or more fire conditions.

24. The system of claim 1,
wherein at least one of the one or more openings is configured such that a person in the mobile booth can perform operations on a particular system outside the mobile booth;
wherein the mobile booth comprises:
one or more air inlets configured to couple with the air moving system, wherein the one or more air inlets are configured to receive air into at least a portion of the interior space of the mobile booth; and
one or more air exits configured to expel air out of the interior space of the mobile booth.

25. The system of claim 5, wherein the one or more openings are configured for the person to reach the particular system or object outside the mobile booth while the person is at least partially in the mobile booth and while the air moving system is moving air through the mobile booth.

26. The system of claim 5, wherein the environmental condition limits comprise predetermined limits for characteristics of air in at least a portion of the mobile booth.

27. The system of claim 5, wherein at least one of the one or more mobile booths comprises lighting configured to illuminate at least a portion of the interior space of the at least one mobile booth.

28. The system of claim 5, wherein the air moving system is configured to maintain the interior space of the mobile booth at a higher pressure than a space outside of the mobile booth.

* * * * *